United States Patent [19]

Netz et al.

[11] Patent Number: 5,283,140

[45] Date of Patent: Feb. 1, 1994

[54] HALFTONE IMAGE SCREENING ARRAY OF PARALLEL LINES WITH EFFECTIVE MAXIMUM AND MINIMUM OPTICAL DENSITY AND METHOD OF GENERATING A HALFTONE IMAGE UTILIZING THE SCREENING ARRAY

[76] Inventors: Yoel Netz, 5 Masada Street, Bat Yam; Arnold Hoffman, 5 Hagra Street, Rehovot, both of Israel

[21] Appl. No.: 981,891

[22] Filed: Nov. 23, 1992

Related U.S. Application Data

[63] Continuation of Ser. No. 553,425, Jul. 17, 1990, abandoned.

[30] Foreign Application Priority Data

Jul. 20, 1989 [IL] Israel ........................................ 91054

[51] Int. Cl.⁵ ............................. G03F 5/08; G03F 7/06
[52] U.S. Cl. ........................................ 430/6; 430/264; 430/265; 430/300; 430/396; 359/893
[58] Field of Search .................... 430/6, 264, 265, 300, 430/396; 359/893; 355/125

[56] References Cited

U.S. PATENT DOCUMENTS

| | | | |
|---|---|---|---|
| 3,647,471 | 3/1972 | Thompson | 430/6 |
| 3,928,038 | 12/1975 | Bergin | 430/6 |
| 4,598,040 | 7/1986 | Netz et al. | 430/265 |
| 4,600,666 | 7/1986 | Zink | 430/6 |

FOREIGN PATENT DOCUMENTS

| | | |
|---|---|---|
| 262065 | 1/1911 | Fed. Rep. of Germany. |
| 477540 | 6/1929 | Fed. Rep. of Germany. |
| 2617683 | 11/1976 | Fed. Rep. of Germany. |

OTHER PUBLICATIONS

C. Shapiro, *The Lithographers Manual*, 4th ed., pp. 6:6–6:7 1966.
Filme und Platten, Rasterphotographie, Die Raster-Photographic, A. F. Gygax, Moderne Chemigraphie in Theorie und Praxis, pp. 91–100.

*Primary Examiner*—Charles L. Bowers, Jr.
*Assistant Examiner*—Christopher G. Young
*Attorney, Agent, or Firm*—Larson and Taylor

[57] ABSTRACT

The invention provides a device for offset and similar printing from a continuous tone original to produce a halftone image on a photosensitive layer comprising means for screening the information via a first array of parallely extending lines of effective minimum optical density and a second array of parallely extending lines of effective maximum optical density, the arrays being interposed to form a composite array of substantially parallel, spaced-apart, alternating lines of effective maximum and minimum optical density, the lines delimiting therebetween zones of effective graduated optical density, the gradient inside each zone progressively varying from low optical density adjacent lines of the first array to high optical density adjacent lines of the second array, the spacing of lines of the first array being between about 100 and 400 lines per inch and wherein the resulting thickness of each reproduced line on a resulting developed photosensitive layer, generated by screening the information via the array, continuously varies as a function of the density of each information point of the original.

13 Claims, 7 Drawing Sheets

HALFTONE IMAGE SCREENING ARRAY OF PARALLEL LINES WITH EFFECTIVE MAXIMUM AND MINIMUM OPTICAL DENSITY AND METHOD OF GENERATING A HALFTONE IMAGE UTILIZING THE SCREENING ARRAY

This application is a continuation of application Ser. No. 07/553,425 filed Jul. 17, 1990, now abandoned.

The present invention relates to devices and methods for offset and similar printing systems.

More particularly, the present invention relates to devices and methods for screening information from a continuous tone original to produce a halftone image on a photosensitive layer.

In particular, the invention relates to a novel screen, photo-mechanically or electronically generated, for the preparation of offset or similar printing plates to be used in offset or similar printing of halftone copies of continuous tone originals.

There exists a wide variety of photomechanical screens. Their purpose is to break up the continuous tone information of the original into discrete dots, whose size is related to the optical density of the original. The resultant film, upon processing, produces a "dot" image of the original.

In the prior art systems all the dots, which are small enough for the eye to reconstruct into a coherent image are of equal opaque optical density while their relative sizes produce the impression of various gray values. The practical resolution of these screens, and those generated electronically (e.g. via an Electronic Dot Generator Scanner) is usually about 100-200 dots/inch.

In the past, the standard screen utilized an array of symmetrical round or square dots. The details of the original reproduced through such a screen are determined by the arbitrary geometrical centers of the dots in the screen. Further, in the resulting halftone, until 50% dot density one has black dots on a transparent background. An abrupt jump in the tonal scale occurs at 50%, where the four corners of the square dot join. This discontinuity prevents smooth midtone transitions.

To overcome the latter limitation, an elliptical, diamond, multi-dot or star-like dot pattern is mainly used in modern offset printing. These dot shapes allow a smoother tonal gradation than the square dot, in the 50% area. Two opposite corners of e.g., the diamond shaped dot, join the adjacent dots first at about 40%, while the other two remaining corners join adjacent dots, near 60%. Since the dots join in two steps, a smoother tonal transformation is achieved. This strategy, of having adjacent dots join in multiple steps, is used, for example, in the Double Dot Policrom Screen and the Triplet Dot HRS Beta Screen. The result is smoother, but far from ideal, as the abrupt jump in tonal scales is only attenuated to some degree. Aside from these jumps the image remains discontinuous in the X and Y direction because of the spacing between the dots in both directions which becomes more apparent with a lower screen ruling.

In contradistinction to said prior art photomechanical screens and methods, using the same or involving electronically generating an effective electronic equivalent thereof, the present invention now provides a device for offset and similar printing methods from a continuous tone original to produce a halftone image on a photosensitive layer comprising means for screening said information via a first array of parallely extending lines of effective minimum optical density and a second array of parallely extending lines of effective maximum optical density, said arrays being interposed to form a composite array of substantially parallel, spaced-apart, alternating lines of maximum and minimum optical density, said lines delimiting therebetween zones of effective graduated optical density, the gradient inside each zone progressively varying from low optical density adjacent lines of said first array to high optical density adjacent lines of said second array, the spacing of lines of said first array being between about 100 and 400 lines per inch and wherein the resulting thickness of each reproduced line on a resulting developed photosensitive layer, generated by screening said information via said array, continuously varies as a function of the density of each information point of the original.

In a preferred embodiment of the present invention there is now provided a photomechanical screen for offset and similar printing methods by screening information from a continuous tone original to produce a halftone image on a photosensitive layer, said screen comprising a first array of parallely extending lines of minimum optical density and a second array of parallely extending lines of maximum optical density, said arrays being interposed to form a composite array of substantially parallel spaced-apart, alternating lines of maximum and minimum optical density, said lines delimiting therebetween zones of graduated optical density, the gradient inside each zone progressively varying from low optical density adjacent lines of said first array to high optical density adjacent lines of said second array, the spacing of lines of said first array being between about 100 and 400 lines per inch and wherein the resulting thickness of each reproduced line on a resulting developed photosensitive layer, generated by screening said information via said array, continuously varies as a function of the density of each information point of the original.

The invention also provides a method for generating a halftone image from a continuous tone original comprising exposing a commercial lith or line film to a continuous tone original via a device as hereinbefore defined wherein the resulting thickness of each resulting line generated on said developed lith or line film continuously varies as a function of the density of each information point of the original.

A preferred embodiment of the present method comprises electronically outputting the information of the original onto an unexposed scanner type film, in an electronic output simulating a screen format,as defined above, the pattern of this screen being lines spaced 100–400 lines/inch without this film being in contact with a standard photomechanical screen.

In another aspect of the present invention there is also provided a method for generating a halftone image from a continuous tone original comprising outputting the information of the original onto an unexposed scanner-type film,in an electronic output simulating a screen format, the pattern of this screen in a screen format, the pattern of this screen being a first array of parallely extending lines of effective minimum optical density and a second array of parallely extending lines of effective maximum optical density, said arrays being interposed to form a composite array of substantially parallel, spaced-apart, alternating lines of effective maximum and minimum optical density, said lines delimiting therebetween zones of effective graduated optical density, the gradient inside each zone progressively varying from low optical density adjacent lines of said first array to high optical density adjacent lines of said second array, the spacing of lines of said first array being between about 400-600 lines per inch and developing in a lith developer containing a hydroquinone developing agent in combination with carbonate, bicarbonate and halide salt together with sodium formaldehyde sulfoxylate and formaldehyde wherein a resulting thickness of each resulting line generated on said scanner type film continuously varies as a function of each information point of the original, but does not decrease in the Dmin region beyond 5 microns width even when the generated line becomes segmented.

In U.S. Pat. No. 4,768,101 there is disclosed a method of generating a half-tone representation of an image from digital data defining the color content of pixels arranged in a series of substantially parallel input scan lines.

U.S. Pat. No. 4,700,235 discloses a method and apparatus for producing half-tone printing forms with screens having arbitrary screen angles and screen width.

U.S. Pat. No. 4,833,546 discloses a photomechanical apparatus adapted to print a half-tone picture corresponding to an original continuous tone picture on the basis of tonal information signals obtained by photoelectrically scanning the original continuous tone picture.

U.S. Pat. No. 4,547,812 discloses a method and apparatus for forming high resolution half-tone images.

U.S. Pat. No. 4,543,613 discloses a method for producing half-tone dots in a half-tone plate recording apparatus.

As will be realized none of said patents teach or suggest the device and method of the present invention.

The present invention provides a screen capable of producing a final printed, ink on paper, resolution of 100-400 lines/inch, which generates a continuous variation in tonal value in one direction, by using a screen composed of fine lines, 100-400 lines/inch. For example, at 250 lines per inch parallel to the direction of the lines, one would say, using prior art concepts and terminology that the segments of a line join to generate an effectively continuous line at about 5-6% dot density. Perpendicular to the direction of the lines, the adjacent lines partially join above 90% dot density.

According to proposed terminology applicable to the novel concept of the present new invention in fact a continuous information straight line from the original, parallely aligned and screened via a line of minimum optical density of the present screening array will be reproduced as a continuous line.

Similarly in the present screening array the width of each line segment is determined by the density of each information point of the original, each such segment having its center along a line of minimum optical density and extending continuously perpendicularly to the direction of the lines on both sides up to the adjacent bracketing lines of maximum optical density.

Since the "dots" join in two steps outside the operational limits of what would be considered in prior art terms as 5%-90% dot density the tonal transformation is, intrinsically, smooth across the whole tonal range, simply because there are no jumps in tonal scale, within this range, in the direction of the lines. The line screen creates a halftone image by continuously changing the width of the parallel lines, comprising the screen pattern. Thus, unlike "dot" based prior art photomechanical or electronic screens, it renders the original continuous tone, in a continuous format, in one direction. For monocolor work, there remains a discontinuity in the direction perpendicular to the lines. However, even in this direction, the image remains black on a white background, until above about 95% dot density. There is no abrupt change to white on black, which is the major cause of disturbance to the eye.

In multicolor printing, where different angles are employed for each of the separations (e.g., here for the line screen, the optimal angles are, 45°, 90°, 105° and 165°), this discontinuity is attenuated, and the result appears to approach a symmetrical continuous tone to the observer.

A possibly more graphic way of explaining the present invention is to state that while the prior art of which applicants are aware is based on symmetrical dot, diamond, elliptical or multi-dot two-dimensional arrays of varying optical density which could be analogized to the peaks and valleys of an egg tray, the present invention is based on parallely extending lines with effective varying optical density of alternating parallely arranged valleys and ridges analogous to a corrugated roof.

In preferred embodiments of the present invention it has been found that using a screening means wherein the distance between lines of said first array are between about 200 and 300 lines per inch with normal rapid access or lith development, will generate a halftone, that with any plate, ink or press, will produce a finer "continuous tone" reproduction of an original continuous tone, than comparable commercially available screens. This is because, intrinsically, these prior art screens are discontinuous in both the X and Y directions, whereas the line screen of the present invention is continuous in the direction of the line.

As will be seen with reference to FIGS. 4 and 5 described hereinafter, below 100 lines per inch the eye will perceive the discrete lines of the line screen pattern and thus while Beta Screen Corp. produces a special effect straight line contact screen having a line density of 55 lines/inch, such a lower range cannot be used for the purposes of the present invention.

According to calculations as set forth in example 1 below, much beyond 400 lines/inch, the width of the lines approaches $5\mu$ for 50% dot density. Below 50%, well above the Dmin value, the line has to be less than $5\mu$, which is too small for graphic art films, so the result is 100% transparent. Over 50%, well below Dmax value, the distance between lines is less than $5\mu$. Again, graphic art films cannot handle it, and silver image will be joined over this distance, creating solid black. Thus for most uses contemplated the effective upper range should not exceed 400 lines per inch.

The invention will now be described in connection with certain preferred embodiments with reference to the following illustrative figures so that it may be more fully understood.

With specific reference now to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Figure 1:
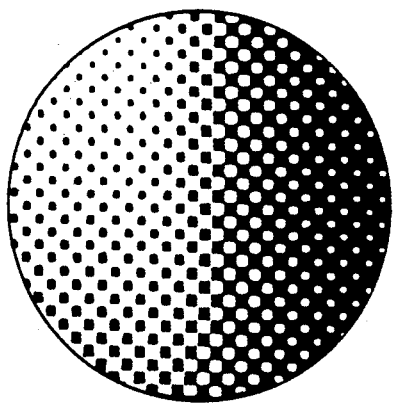
FIGS. 1, 2 and 3 are representations of dot arrays of prior art photomechanical screens.
Figure 2:
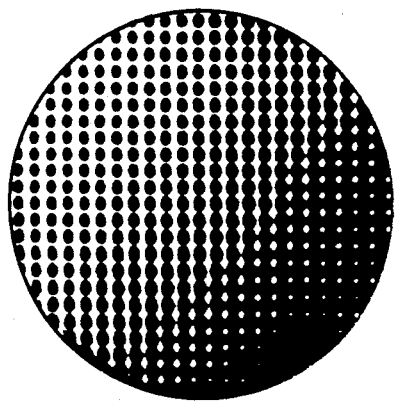
Figure 3:
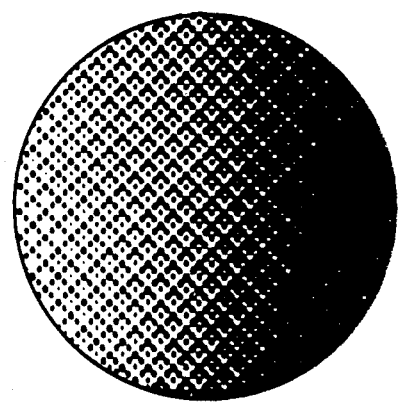

Referring now to the drawings in detail, FIGS. 1, 2 and 3 have merely been provided as background for a better visual understanding of the state of the prior art in which photomechanical contact screen employed arrays of square dots (FIG. 1), elliptical dots (FIG. 2) and the HRS Triplet Dot$^{(R)}$ (FIG. c) of Beta Screen Corp.

Figure 4:
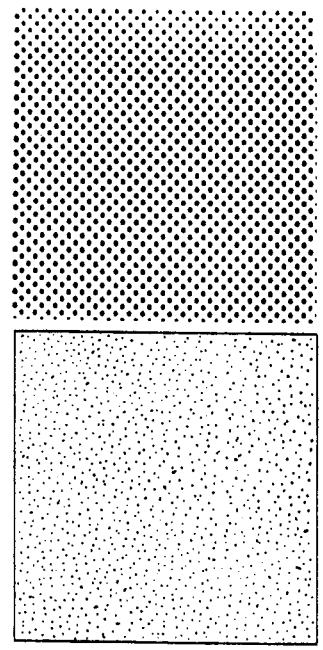
FIG. 4 is a representation of a dot array at a density of 25 and 85 dots per inch, respectively.
Figure 5:
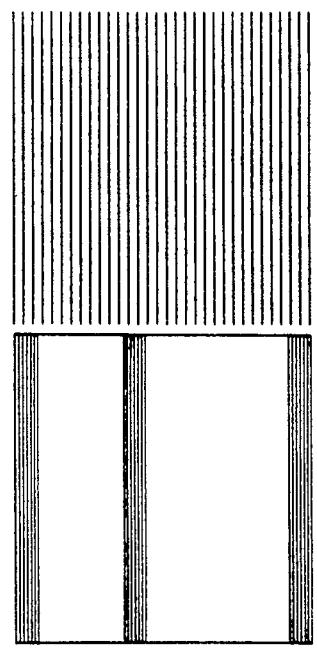
FIG. 5 is a representation of a line array at a density of 25 and 85 lines per inch.

FIGS. 4 and 5 provide a comparison of a standard screen format and a line pattern at a dot and line density of 25 and 85 per inch respectively. As can be seen already at a density of 85 lines per inch the line pattern appears more "continuous tone" than the standard format.

It follows from the above that a new type of screen pattern, imposed on the film, comprising lines spaced between 100-400 to the inch where the thickness of the line is a function of the density in the original, will provide a continuous tone reproduction, superior to other screens, as will be shown with reference to further figures appended hereto.

EXAMPLE 1

Figure 6:
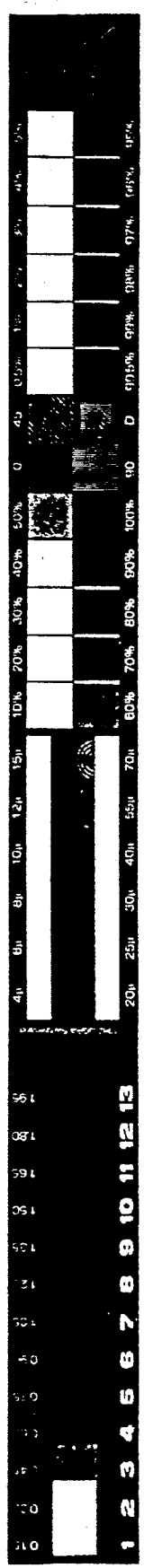
FIG. 6 is a contact of a resolution target produced using prior art film and chemistry.

Standard lith film (Agfa DLD510) was exposed through a resolution target and developed in standard lith developer (Agfa G 110C). Segment A of FIG. 6 shows 6μ width black continuous lines on white background. Lines less than 6μ width effectively disappear. White lines on a black background start to appear continuous from a width of about 8μ. At widths smaller than about 8μ, the lines join each other. Good quality printing requires a minimum density (Dmin) of 5-6% in the highlight region and a maximum density (Dmax) of 90-95% in the shadow region. For a 250 lines/in ruling, 5-6% density corresponds to a 5-6μ line width, according to the following calculation:

$$\text{line width } (w) \text{ (in microns)} = \frac{1 \text{ inch}}{\text{lines per inch}} \times \frac{2.54 \times 10^4 \mu}{1 \text{ inch}}$$

For example, the width in microns of a line in a screen of 250 lines per inch is $1/250 \times 2.54 \times 10^4 = 100\mu$.

This calculation generates the following table:

| Density | Approximate Line Width | | | |
| --- | --- | --- | --- | --- |
| | 133 LPI | 150 LPI | 250 LPI | 300 LPI |
| 100 (solid black) | 200 | 160 | 100 | 80 |
| 50 | 100 | 80 | 50 | 40 |
| 5 | 10 | 8 | 5 | 4 |
| Density (%) corres. to 10μ line width. | 5 | 6 | 10 | 12 |

As shown in FIG. 6 a screen ruling of about 250 lines per inch can provide continuous lines even in the highlight region. In the shadow region, the halftone requires only 85-90% density to provide the 90-95% density printed result, because of the limitations of the printing technology at a 250 lines/in resolution. An 8μ width of white lines which corresponds to more than 90% density black remains, as shown in FIG. 6 continuous; i.e. the lines do not join up or close up. Consequently, from the highlight to the shadow region, the image is made up, respectively of continuous and well separated lines. This analysis thus teaches that a ruling in the range of about 250 lines/inch with standard reprographic film and chemistry will produce a superior halftone as described, e.g., hereinafter with reference to FIG. 14.

FIG. 6 also shows that a ruling less than 250 line/in produces continuous, well separated, parallel lines. At high resolution, e.g., 500-600 lines/in, the usable, reproducible and printable lines correspond to too high a Dmin and too low a Dmax, to obtain a good quality image with standard lith film and chemistry since all lower densities do not appear and all higher densities create a solid black image. With a special lith chemistry, as described in U.S. Pat. No. 4,598,040, even this high resolution produces good values of Dmin and Dmax, even though the lines are not absolutely contiguous, as described in example 3 hereinafter.

Figure 7:
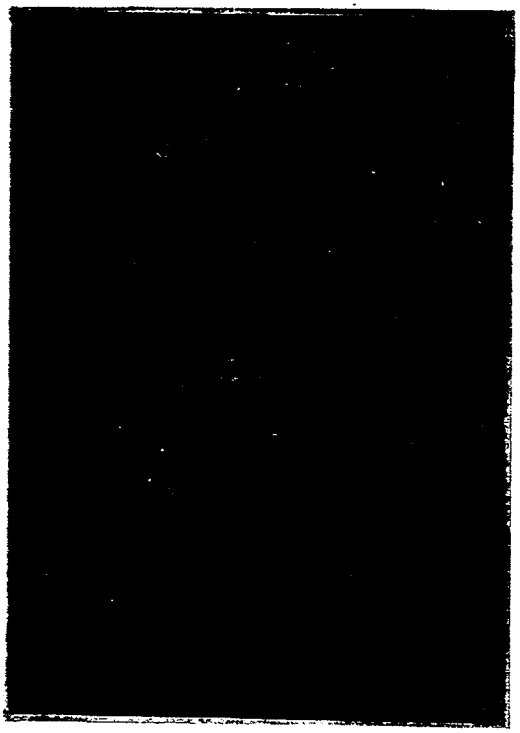
FIG. 7 is a contact positive produced according to the present invention.
Figure 8:
FIG. 8 is a comparison contact positive produced using a prior art dot screen.

EXAMPLE 2—FIGS. 7 and 8 (girl)

An image was exposed through a 55 line/in screen (Beta Screens) onto a standard lith film (Agfa 812) and processed in standard lith developer (Agfa G 90P). This was reduced about 55%, on Agfa 812 film and developed in Agfa G 90P generating a ruling of 100 lines/in. This resultant "line screened" image was exposed onto a standard lith (Agfa 812) and developed in standard lith developer (Agfa G 90P). The resulting black and white contact positive using Agfa-Gevaert Litex paper developed in D-11 is shown in FIG. 7. As a Control, the same continuous tone image used above was exposed through a conventional dot screen (Agfa Gevaert) with a ruling of 100 dots/in, onto a standard lith film (Agfa 812) and developed in a standard lith developer (Agfa G 90P). The resulting contact positive on Agfa-Gevaert Litex paper developed in D-11 is shown in FIG. 8. This demonstrates that the "line screen" image produces a smoother transition of tones (i.e. a better continuous tone) relative to a standard screen, in this domain of screen ruling.

Figure 9:
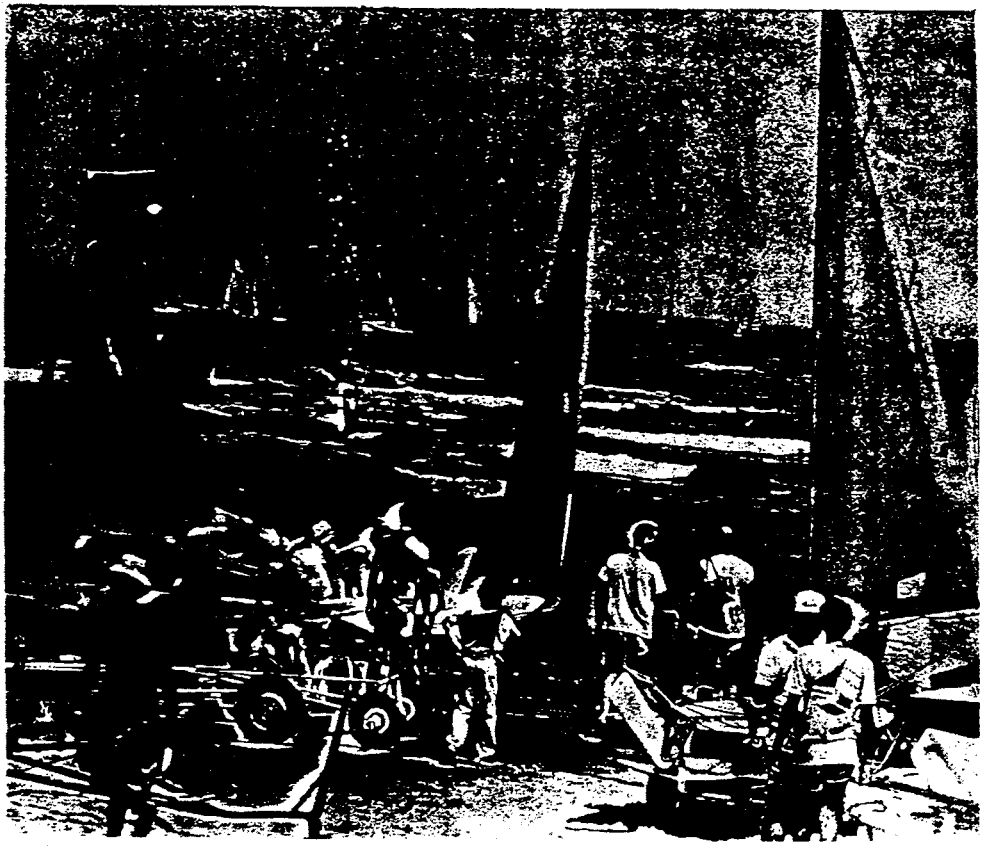
FIG. 9 is a developed scanner film produced using a line density of 500 lines/inch, according to the invention.

EXAMPLE 3—FIG. 9 (Beach Scene)

An Itek continuous tone scanner (Model 200) outputs at 500 lines/ in. FIG. 9 shows the results of this 500 line/in output onto a standard scanner film (Agfa 812) using a special lith developer, containing a hydroquinone developing agent in combination with carbonate, bicarbonate and halide salt together with sodium formaldehyde sulfoxylate and formaldehyde as described in U.S. Pat. No. 4,598,040, the teachings of which are incorporated herein by reference. (At this resolution, a color separation can be made without requiring adjustment of angles, to minimize Moire).

Careful inspection of FIG. 9 reveals in the highlight area, relatively continuous lines, comprising short line segments in excess of $5\mu$ wide spaced close enough to each other to give an impression of continuity along their axis, and in the shadows, longer line segments which tend to "close up" partially, near Dmax. As will be realized from this Figure, in the highlight region the width of the line segments are $5-10\mu$ but they generate these low densities by varying the length of the segments at the expense of spacing between the segments on the same lines of the produced halftone. In the shadow region the width of the lines are $40-45\mu$ and continuous. The high resolution of 500 lines per inch or $50\mu$ distance between adjacent lines is obtained because the low density region, e.g., 5% is not comprised of solid black lines of $2.5\mu$ width which is not printable, but rather of line segments 5-10 wide with suitable spacing between the segments in the produced halftone.

EXAMPLE 4—FIGS. 10-13

Figure 10:
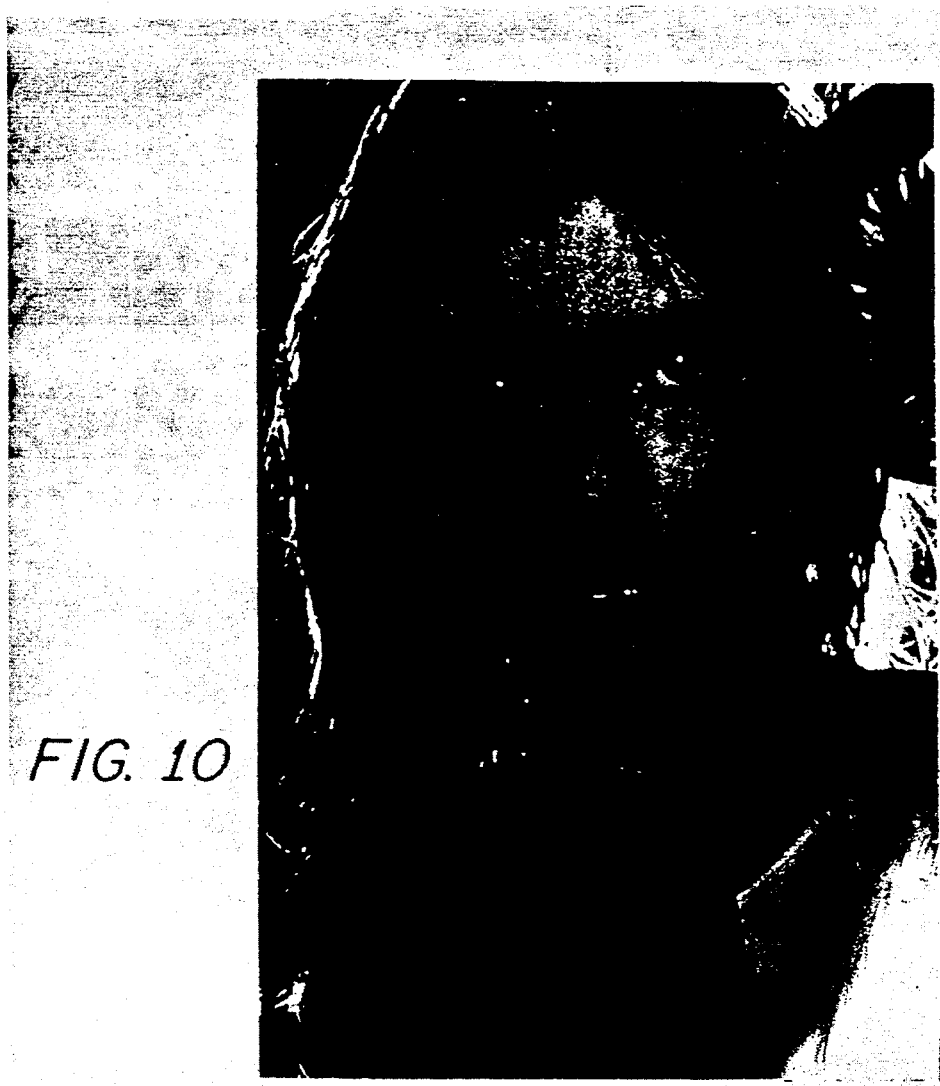
FIG. 10 is a black and white reproduction of a color print produced according to the present invention.
Figure 11:
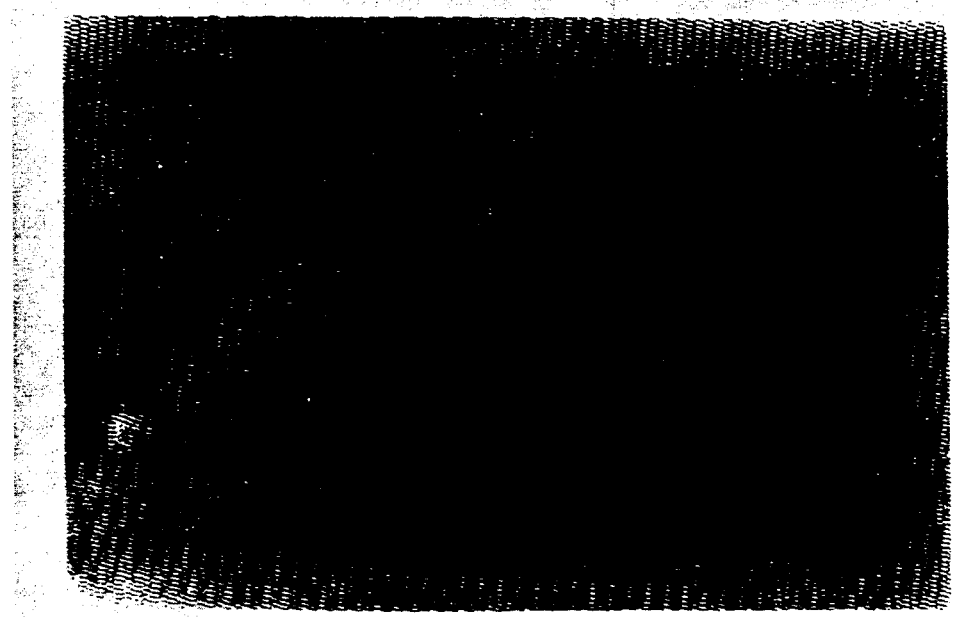
FIG. 11 is an enlargement by about X8 of the eye of FIG. 10.
Figure 12:
FIG. 12 is a black and white reproduction of a comparison color print produced using an electronically generated dot screen according to the prior art.
Figure 13:
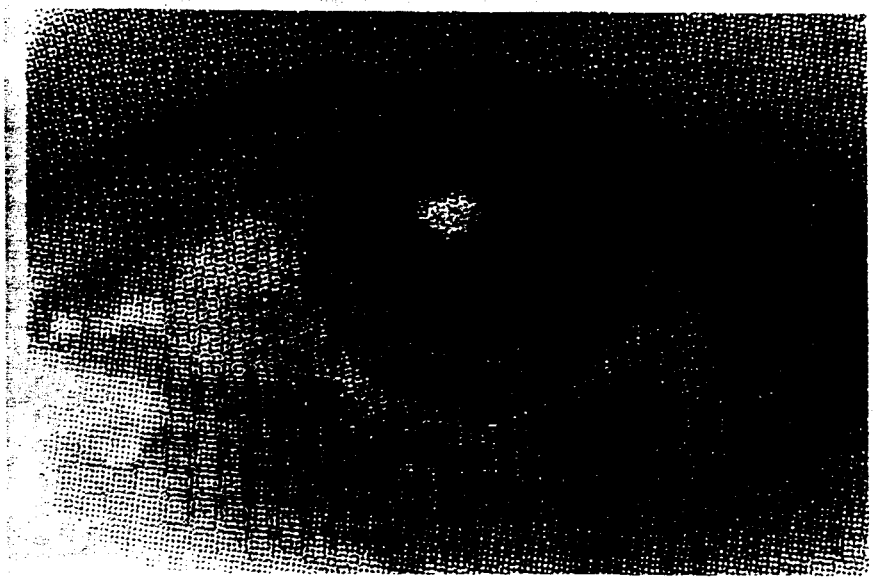
FIG. 13 is an enlargement by about X8 of the eye of FIG. 12.

A color separation set (cyan, magenta, yellow, black) was prepared, where each color was produced electronically as a line screen, each aligned 30 degrees from each other, onto a standard red sensitive scanner film (Anitec) and developed in standard rapid access developer (Anitec), at a ruling of 254 lines/in using a LaserPaint$^{(R)}$Macintosh$^{(R)}$/Linotronic 300$^{(R)}$ System. Contacts of each of the 4 films in the set were made using standard lith film (Agfa) 812) and developing in a special lith developer, as described in U.S. Pat. No. 4,598,040. A black and white reproduction of the resulting color print is shown in FIG. 10, and FIG. 11 is an enlargement of about X8 of the eye of FIG. 10. The control was made using a normal 2-directional electronically generated screen format with a ruling of 254 dots/in the screen, angles being dealt with in the standard way. A black and white reproduction of the resulting color print is shown in FIG. 12, and FIG. 13 is an enlargement of about X8 of the eye of FIG. 12. Note, that in this case, this color separation generates 8 lines effectively (2 for each color) whose relative angles have been considered to minimize Moire vis only 4 lines for the line screen. Offset plates were prepared from these color separations, and they were printed up in the standard way. Comparison of FIG. 10 with FIG. 12 demonstrates that the advantages of a "line screen" for color is even greater than that for black and white.

Figure 14:
FIG. 14 is a black and white reproduction of a color photo of a color print produced according to the present invention.
Figure 15:
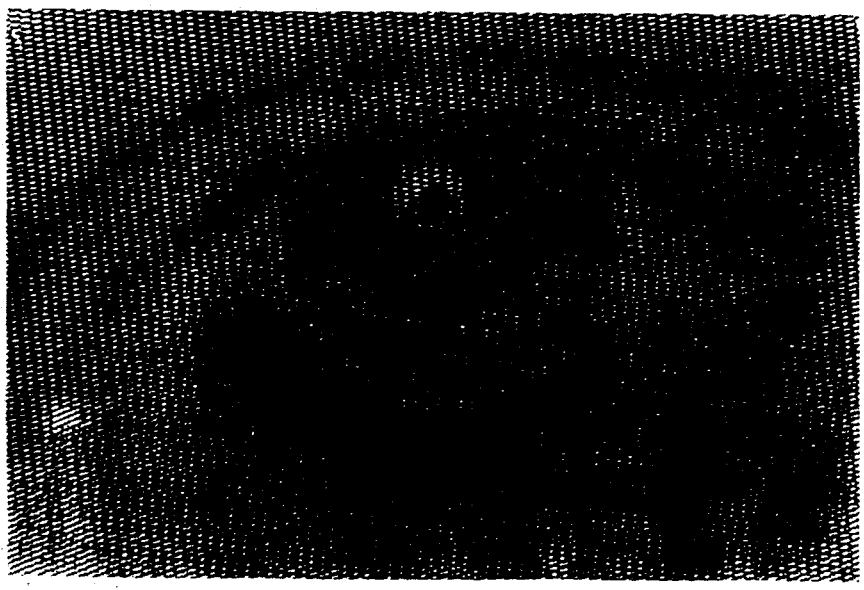
FIG. 15 is an enlargement by about X8 of the eye of FIG. 14.

EXAMPLE 5—FIGS. 14 and 15

A color separation set (cyan, magenta, yellow, black) was prepared, where each color was produced electronically as a line screen, aligned 30 degrees from each other onto a standard red sensitive scanner film (Anitec) and developed in standard rapid access developer (Anitec), at a ruling of 250 lines/in, using a LaserPaint-$^R$Macintosh$^R$/Linotronic 300$^R$System. Offset plates were prepared from these color separations, and they were printed up in the standard way. A black and white reproduction of the resulting color print is shown in FIG. 14 and in the enlargement of FIG. 15, which confirms the analysis in Example 1, i.e., at about 250 lines-/in, using standard scanner film/chemistry system, a reasonably continuous line is generated in the highlights, a broader and really continuous line in the middletones, without getting a "closing up" (discontinuous) effect (i.e. the lines remain parallel without joining) in the shadows, until the Dmax region is approached.

It will be evident to those skilled in the art that the invention is not limited to the details of the foregoing illustrative embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A device for offset and similar printing from a continuous tone original to produce a halftone image on a photosensitive layer comprising means for screening said information via a first array of parallely extending lines of effective minimum optical density and a second array of parallely extending lines of effective maximum optical density, said arrays being interposed to form a composite array of substantially parallel, spaced-apart, alternating lines of effective maximum and minimum optical density, said lines delimiting therebetween zones of effective graduated optical density, the gradient inside each zone progressively varying from low optical density adjacent lines of said first array to high optical density adjacent lines of said second array, the spacing of lines of said first array being between 100 and 400 lines per inch and wherein the resulting thickness of each reproduced line on a resulting developed photosensitive layer, generated by screening said information via said array, continuously varies as a function of the density of each information point of the original.

2. A device according to claim 1 wherein the spacing of lines of said first array is between about 200 and 300 lines per inch.

3. A photomechanical screen according to claim 1 for offset and similar printing by screening information from a continuous tone original to produce a halftone image on a photosensitive layer, said screen comprising a first array of parallely extending lines of minimum optical density and a second array of parallely extending lines of maximum optical density, said arrays being interposed to form a composite array of substantially parallel spaced-apart, alternating lines, of maximum and minimum optical density, said lines delimiting therebetween zones of graduated optical density, the gradient inside each zone progressively varying from low optical density adjacent lines of said first array to high optical density adjacent lines of said second array, the spacing of lines of said first array being between 100 and 400 lines per inch and wherein the resulting thickness of each reproduced line on a resulting developed photosensitive layer, generated by screening said information via said array, continuously varies as a function of the density of each information point of the original.

4. A method for generating a halftone image from a continuous tone original comprising exposing a commercial lith or line film to a continuous tone original via a device comprising means for screening information from said continuous tone original via a first array of parallelly extending lines of effective minimum optical density and a second array of parallelly extending lines of effective maximum optical density, said arrays being interposed to form a composite array of substantially parallel, spaced-apart, alternating lines of effective maximum and minimum optical density, said lines delimiting therebetween zones of effective graduated optical density, the gradient inside each zone progressively varying from low optical density adjacent lines of said first array to high optical density adjacent lines of said second array and the spacing of lines of said first array being about 100 to 400 lines per inch, wherein the resulting thickness of each resulting line generated on said exposed lith or line film as a result of said screening via said composite array continuously varies as a function of the density of each information point of the original.

5. A method according to claim 4 wherein the line spacing of said first array is about 100 to 300 lines per inch.

6. A method according to claim 5 wherein the line spacing of said first array is from 200–300 lines per inch.

7. A method for generating a halftone image from a continuous tone original comprising electronically outputting the information of the original onto an unexposed scanner type film in the absence of a standard photomechanical screen in an electronic output simulating a screen format, the pattern of this screen being a first array of parallelly extending lines of effective minimum optical density and a second array of parallelly extending lines of effective maximum optical density, said arrays being interposed to form a composite array of substantially parallel, spaced-apart, alternating lines of effective maximum and minimum optical density, said lines delimiting therebetween zones of effective graduated optical density, the gradient inside each zone progressively varying from low optical density adjacent lines of said first array to high optical density adjacent lines of said second array and the spacing of lines of said first array being about 100 to 400 lines per inch, wherein the resulting thickness of each resulting line generated on said exposed scanner type film as a result of said electrical output continuously varies as a function of the density of each information point of the original.

8. A method according to claim 7 wherein the line spacing of said first array is about 100 to 300 lines per inch.

9. A method according to claim 8 wherein the line spacing of said first array is from 200–300 lines per inch.

10. A method according to claim 7, comprising electronically separating and outputting the information of a color original, onto four separate unexposed the information of a color original, onto four separate unexposed scanner type films, without said films being in contact with a standard photomechanical screen, each separation generated at different angles to attenuate Moire.

11. A method according to claim 10 wherein said angles are 45°, 90°, 105° and 165° respectively.

12. A method according to claim 10 wherein the angles between the separations are 30°.

13. A method for generating a halftone image from a continuous tone original comprising outputting the information of the original onto an unexposed scanner-type film, in an electronic output simulating a screen format, the pattern of this screen being a first array of parallely extending lines of effective minimum optical density and a second array of parallely extending lines of effective maximum optical density, said arrays being interposed to form a composite array of substantially parallel, spaced-apart, alternating lines of effective maximum and minimum optical density, said lines delimiting therebetween zones of effective graduated optical density, the gradient inside each zone progressively varying from low optical density adjacent lines of said first array to high optical density adjacent lines of said second array, the spacing of lines of said first array being between about 400–600 lines per inch and developing in a lith developer containing a hydroquinone developing agent in combination with carbonate, bicarbonate and halide salt together with sodium formaldehyde sulfoxylate and formaldehyde wherein a resulting thickness of each resulting line generated on said scanner type film continuously varies as a function of each information point of the original, but does not decrease in the Dmin region beyond 5 microns width even when the generated line becomes segmented.

* * * * *

US005283140B1

REEXAMINATION CERTIFICATE (4031st)

United States Patent [19]
Netz et al.

[11] B1 5,283,140
[45] Certificate Issued Apr. 4, 2000

[54] HALFTONE IMAGE SCREENING ARRAY OF PARALLEL LINES WITH EFFECTIVE MAXIMUM AND MINIMUM OPTICAL DENSITY AND METHOD OF GENERATING A HALFTONE IMAGE UTILIZING THE SCREENING ARRAY

[75] Inventors: Yoel Netz, Bat Yam; Arnold Hoffman, 5 Hagra Street, Rehovot, both of Israel

[73] Assignee: Arnold Hoffman, Rehovot, Israel

Reexamination Requests:
No. 90/005,006, Jun. 3, 1998
No. 90/005,263, Feb. 22, 1999

Reexamination Certificate for:
Patent No.: 5,283,140
Issued: Feb. 1, 1994
Appl. No.: 07/981,891
Filed: Nov. 23, 1992

Related U.S. Application Data

[63] Continuation of application No. 07/553,425, Jul. 17, 1990, abandoned.

[30] Foreign Application Priority Data

Jul. 20, 1989 [IL] Israel ............................................ 91054

[51] Int. Cl.⁷ .............................. G03F 5/08; G03F 7/06
[52] U.S. Cl. ............................. 430/6; 430/264; 430/265; 430/300; 430/396; 359/893
[58] Field of Search ............................... 430/6, 264, 265, 430/300, 396; 359/893; 355/125

[56] References Cited

U.S. PATENT DOCUMENTS

| | | |
|---|---|---|
| 498,396 | 5/1893 | Kurtz . |
| 2,914,407 | 11/1959 | Meyer . |
| 3,152,528 | 10/1964 | Pendry . |
| 3,332,775 | 7/1967 | Mandler . |
| 3,657,472 | 4/1972 | Taudt et al. . |
| 3,916,096 | 10/1975 | Everett et al. . |
| 3,928,038 | 12/1975 | Bergin . |
| 3,948,171 | 4/1976 | O'Connell . |
| 3,983,319 | 9/1976 | Moe et al. . |
| 4,003,649 | 1/1977 | Goren et al. . |
| 4,007,981 | 2/1977 | Goren . |
| 4,142,462 | 3/1979 | Gilgore . |
| 4,236,809 | 12/1980 | Kermisch ................................. 355/4 |
| 4,262,070 | 4/1981 | Liu ............................................. 430/6 |
| 4,543,613 | 9/1985 | Sakamoto ............................... 358/298 |
| 4,547,812 | 10/1985 | Waller et al. ........................... 358/283 |
| 4,598,040 | 7/1986 | Netz et al. .............................. 430/405 |
| 4,700,235 | 10/1987 | Gall ......................................... 358/283 |
| 4,768,101 | 8/1988 | Webb ...................................... 358/298 |
| 4,800,442 | 1/1989 | Riseman et al. ........................ 358/280 |
| 4,903,123 | 2/1990 | Kamamura et al. ..................... 358/75 |
| 5,055,923 | 10/1991 | Kitagawa et al. ....................... 358/75 |

FOREIGN PATENT DOCUMENTS

| | | |
|---|---|---|
| 99138 | 1/1984 | European Pat. Off. . |
| 370271 | 5/1990 | European Pat. Off. . |
| 2617683 | 4/1976 | Germany . |
| 21969 | of 1863 | United Kingdom . |

OTHER PUBLICATIONS

Sheet Entitled "Caprock Special Effect Contact Screens;" date unknown but assumed to be more than a year before the effective filing date of the first U.S. application in the chain leading to this application.

Sheet entitled "Rasterkonfigurationen;" date unknown but assumed to be more than a year before the effective filing date of the first U.S. application in the chain leading to this application; see item 8 on the left side referring to Linen–raster and Effektraster.

Photographische Mitteilungen fur Fachmanner und Liebhaber von Professor Dr. H.W. Vogel 31 Jahrg. (1894–1895) (title and relevant pages).

"A Half Century of Color," by Louis Walton Sipley (1951) (title page and relevant pages).

SG–818 Direct Scanagraph Brochure (French–language) (Dainippon Screen Mfg. Co. Ltd. 1984).

Magnascan 626/636/646 E/M Operator's Manual (relevant pages) (Crosfield Electronics Limited Apr. 1988).

"High Quality Pictorial Xerographic Reproduction By Halftone Screening," by Robert N. Goren (Electrophotography Fourth International Conference, SPSE, Nov. 16–18, 1981).

Ulichney, Digital Halftoning, §5.2.3 (MIT Press 1987).

Morgenstern, D., "Rasterungstechnik Fotomechanisch Und Elektronich", Polygraph verlag Gmbh (1985).

Goren, R.N., "High Quality Xerographic Reproduction by Halftone Screening", Electrophotography Fourth International Conference, pp. 299–317 (1981) (S.E. Ing, M.D. Tabak and W.E. Hass eds.).

Stucki, P., "Image Processing for Document Reproduction", Advances in Digital Image Processing, pp. 177–218 (Plenum Press 1979).

"Rasters en hun toepassing" (Raster–Union 1988).

(List continued on next page.)

*Primary Examiner*—Christopher G. Young

[57] ABSTRACT

The invention provides a device for offset and similar printing from a continuous tone original to produce a halftone image on a photosensitive layer comprising means for screening the information via a first array of parallely extending lines of effective minimum optical density and a second array of parallely extending lines of effective maximum optical density, the arrays being interposed to form a composite array of substantially parallel, spaced-apart, alternating lines of effective maximum and minimum optical density, the lines delimiting therebetween zones of effective graduated optical density, the gradient inside each zone progressively varying from low optical density adjacent lines of the first array to high optical density adjacent lines of the second array, the spacing of lines of the first array being between about 100 and 400 lines per inch and wherein the resulting thickness of each reproduced line on a resulting developed photosensitive layer, generated by screening the information via the array, continuously varies as a function of the density of each information point of the original.

OTHER PUBLICATIONS

Ulichney, R., "Digital Halftoning" (MIT Press 1987).
Dessauer and Clark, pp. 485–487 (1965).
Sipley, L.W., "The Photomechanical Halftone" (1958).
Yule, J.A.C., "Principles of Color Reproduction" 13 (1967).
Molia, R.K., "Electronic Color Separation" (1988).
Postscript Language Reference Manual, p. 82 (1985).

"Filme und Platten Rasterphotographie," Moderne Chemigraphie in Theorie und Praxis, Polygraph Verlag GmBH, Frankfurt 1957, pp. 91–100.

"Publish," Jun. 1991, p. 76.

Bringdahl, O., "Halftone images: Spatial resolution and tone reproduction," J. Opt. Soc. Am., vol. 68, No.3, Mar. 1978, pp. 416–422.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 1, after line 33.
*As known in the art, Electronic Dot Generators (EDG) are pixel-based systems that selectively expose, with light, pixel positions arranged in a regular grid, to electronically screen digital color separation information via an electronic screen format simulating the effect of a screen so that local density in an original is represented by a number of pixel positions in an EDG output, thus creating digitally screened images.*
Column 7, after line 39.
*As known in the art, the system inherently represents local density in an original by a number of pixels in an output, as in an EDG system. As further known, in a line screen output, a local density in an original is related to a local thickness of a line and, in the case of EDG output made to simulate the effect of a line screen, a number of pixel positions across a line.*

AS A RESULT OF REEXAMINATION, IT HAS BEEN DETERMINED THAT:

The patentability of claim 13 is confirmed.

Claims 3, 7–9 are cancelled.

Claims 1, 4 and 10 are determined to be patentable as amended.

Claims 2, 5, 6, 11 and 12, dependent on an amended claim, are determined to be patentable.

New claims 14–35 are added and determined to be patentable.

1. A device for offset and similar printing *of a faithful color reproduction* from a continuous tone *color* original to produce a *respective digitally line-screened* halftone image on a photosensitive layer *for each of at least four process colors, in the absence of a standard photomechanical screen,* by selectively exposing, with light, pixel positions of a regular grid on the basis of digital color separation information from said original, comprising means for *electronically* screening said *digital color separation* information *for the respective process colors* via *a digital electronic screen format simulating the effect of* a first array of parallelly extending lines of effective mimimum optical density and a second array of parallelly extending lines of effective maximum optical density, said arrays being interposed to form a composite array of substantially parallel, spaced-apart, alternating lines of effective maximum and minimum optical density, said lines delimiting therebetween zones of effective graduated optical density, the gradient inside each zone progressively varying from low optical density adjacent lines of said first array to high optical density adjacent [lines of] said second array, the spacing of lines of said first array being [between] *about* 100 [and] *to* 400 lines per inch, *wherein a local density of a given color in the original is represented by a plurality of pixel positions across a respective one of said lines, said lines being formed as latent screened images and developed on a resulting developed photosensitive layer as reproduced lines, and wherein the resulting thickness of each reproduced line on a resulting developed photosensitive layer, generated by electronically screening said information via said screen format simulating the effect of said array, continuously varies as a function of the density of each information point of the respective color separation from the original, wherein the latent image lines are substantially uniformly spaced for each of the process colors and are at different angles with respect to each other for the different process colors to attenuate Moire and produce a faithful reproduction of the original.*

4. A method for generating a *respective* halftone, *digitally scanned latent image for each of at least four process colors* from a continuous tone *color* original *comprising exposing a commercial lith or line film to a respective digital, line-screened image for each of the at least four process colors based on digital color separation information from* a continuous tone *color* original, *said exposing being* via a device comprising means for *electronically* screening *said digital color separation* information from said continuous tone original, *in the absence of a standard photomechanical screen,* via *an electronic screen format simulating the effect of* a first array of parallelly extending lines of effective minimum optical density and a second array of parallelly extending lines of effective maximum optical density, said arrays being interposed to form a composite array of substantially parallel, spaced-apart, alternating lines of effective maximum and minimum optical density, said lines delimiting therebetween zones of effective graduated optical density, the gradient inside each zone progressively varying from low optical density adjacent lines of said first array to high optical density adjacent [lines of] said second array [and], the spacing of lines of said first array being [between] *about* 100 [and] *to* 400 lines per inch, *and producing respective latent image lines at said film by selectively exposing, with light, regularly arranged pixel positions at the film to produce groups of exposed pixel positions, said groups varying at least in size, in directions across the lines, in accordance with information resulting from said electronic screening to thereby vary the thickness of the latent image lines and form a respective latent image,* wherein the resulting thickness of each resulting line generated on said exposed lith or line film as a result of said *electronic* screening via *said screen format simulating the effect of* said composite array *and as a result of said exposing of areas of the film with light,* continuously varies as a function of the density of each information point of *the respective color separation of* the original, *and wherein said resulting lines are substantially uniformly spaced for each of the process colors and are at different angles with respect to each other for the different process colors to attenuate Moire for a faithful reproduction of said color original.*

10. A method according to claim 7, comprising electronically separating and outputting the information of a color original, [onto four separate unexposed the information of a color original,] onto four separate unexposed scanner type films, without said films being in contact with a standard photomechanical screen, each separation generated at different angles to attenuate Moire.

*14. A method according to claim 10, in which the outputting of the information of a color original onto four* separate scanner type films comprises scanning each of the films with light to expose areas of the film that effectively vary at least in size in accordance with respective digital information electronically separated from the color original in the absence of a standard photomechanical screen, said areas forming said lines generated on the film, to thereby form a respective latent image on each of the four separate scanner type films.

15. A method according to claim 14, in which the outputting of the information of a color original onto four separate scanner type films comprises effecting irreversible changes in each of the scanner type films.

16. A method as in claim 14, comprising developing each of the latent images into a respective developed image.

17. A method as in claim 16, comprising developing the latent images by effecting irreversible changes in the scanner type films bearing the respective latent images.

18. A method as in claim 16, comprising transferring the respective developed images onto a substrate such as paper in registered superposition and at said different angles to attenuate Moire to thereby produce a faithful but non-continuous tone copy of the original.

19. A method as in claim 18, in which the transferring of the respective developed images comprises using an offset printing process.

20. A method as in claim 16, in which the outputting of the information of the color original comprises spacing the lines in each of the scanner type films substantially uniformly and providing substantially the same spacing of lines in all of the scanner type films.

21. A method as in claim 20, in which each of the respective halftone developed images has an optical density that varies at least at a periphery of said lines in a direction transverse to the lengths of the lines.

22. A method as in claim 20, in which the outputting of the information of the original comprises forming lines that are substantially continuous and unbroken along the length of the lines and remain as separate lines over a density range from no more than about 25% through no less than about 75% in the developed images.

23. A method as in claim 22, in which the lines remain substantially continuous over a density range from no more than about 15% through no less than about 85%.

24. A method as in claim 14, in which the four separate scanner type films are physically separate from each other.

25. A method as in claim 14, in which the four separate scanner type films are exposed to light substantially concurrently.

26. A method as in claim 10, in which the outputting of the information of the original comprises forming lines that are substantially continuous and unbroken along the length of the lines and remain as separate lines over a density range from no more than about 25% through no less than about 75% in each of said separations.

27. A method as in claim 26, in which the lines remain substantially continuous over a density range from no more than about 15% to no less than about 85%.

28. A method as in claim 26, in which the lines in each of said separations are substantially uniformly spaced within a separation and are subtantially at the same pitch for all the separations.

29. A device according to claim 1, in which said photosensitive layer is a photographic film.

30. A device as in claim 1, in which the photosensitive layer is developed irreversibly into said developed photosensitive layer.

31. A device for offset and similar printing of a faithful color reproduction from a continuous tone color original to produce a respective digitally line-screened halftone image on a photosensitive layer for each of at least three process colors, in the absence of a standard photomechanical screen, by selectively exposing with light pixel positions of a regular grid on the basis of digital color separation information from said original, comprising means for electronically screening said digital color separation information for the respective process colors via a digital electronic screen format simulating the effect of a first array of parallelly extending lines of effective minimum optical density and a second array of parallelly extending lines of effective maximum optical density, said arrays being interposed to form a composite array of substantially parallel, spaced-apart, alternating lines of effective maximum and minimum optical density, said lines delimiting therebetween zones of effective graduated optical density, the gradient inside each zone progressively varying from low optical density adjacent lines of said first array to high optical density adjacent said second array, the spacing of lines of said first array being about 100 to 400 lines per inch, wherein a local density of a given color in the original is represented by a plurality of pixel positions across a respective one of said lines, said lines being formed as latent screened images and developed on a resulting developed photosensitive layer as reproduced lines, and wherein the resulting thickness of each reproduced line on a resulting developed photosensitive layer, generated by electronically screening said information via said screen format simulating the effect of said array, continuously varies as a function of the density of each information point of the respective color separation from the original, wherein the latent image lines are substantially uniformly spaced for each of the process colors and are at different angles with respect to each other for the different process colors to attenuate Moire and produce a faithful reproduction of the original.

32. A method for generating a respective halftone, digitally scanned latent image for each of at least three process colors from a continuous tone color original comprising exposing a commercial lith or line film to a respective digital, line-screened image for each of the at least three process colors based on digital color separation information from a continuous tone color original, said exposing being via a device comprising means for electronically screening said digital color separation information from said continuous tone original, in the absence of a standard photomechanical screen, via an electronic screen format simulating the effect of a first array of parallelly extending lines of effective minimum optical density and a second array of parallelly extending lines of effective maximum optical density, said arrays being interposed to form a composite array of substantially parallel, spaced-apart, alternating lines of effective maximum and minimum optical density, said lines delimiting therebetween zones of effective graduated optical density, the gradient inside each zone progressively varying from low optical density adjacent lines of said first array to high optical density adjacent said second array, the spacing of lines of said first array being about 100 to 400 lines per inch, and producing respective latent image lines at said film by selectively exposing, with light, regularly arranged pixel positions at the film to produce groups of exposed pixel positions, said groups varying at least in size, in directions across the lines, in accordance with information resulting from said electronic screening to thereby vary the thickness of the latent image lines and form a respective latent image, wherein the resulting thickness of each resulting line generated on said exposed lith or line film as a result of said electronic screening via said screen format simulating the effect of said composite array and as a result of said exposing of areas of the film with light, continuously varies as a function of the density of each information point of the respective color separation of the original, and wherein said resulting lines are substantially uniformly spaced for each of the process colors and are at different angles with respect to each other for the different process colors to attenuate Moire for a faithful reproduction of said color original.

33. A method according to claim 32, in which said exposing comprises effecting irreversible changes in the film.

34. A method according to claim 32, including developing the film after said exposing.

35. A method according to claim 34, in which said developing effects irreversible changes in the film.

* * * * *